United States Patent
Kang (10) Patent No.: US 10,544,515 B2
(45) Date of Patent: Jan. 28, 2020

(54) COATING METHOD FOR A PLASMA BLOCK AND A PLASMA BLOCK COATED BY THE SAME

(71) Applicant: Dong Won Kang, Suwon (KR)

(72) Inventor: Dong Won Kang, Suwon (KR)

( * ) Notice: Subject to any disclaimer, the term of this patent is extended or adjusted under 35 U.S.C. 154(b) by 0 days.

(21) Appl. No.: 15/894,941

(22) Filed: Feb. 13, 2018

(65) Prior Publication Data

US 2018/0371634 A1 Dec. 27, 2018

(30) Foreign Application Priority Data

Jun. 27, 2017 (KR) .................. 10-2017-0081374

(51) Int. Cl.
| | |
|---|---|
| C23C 14/00 | (2006.01) |
| C25D 7/04 | (2006.01) |
| C25D 9/10 | (2006.01) |
| H01J 37/24 | (2006.01) |
| H01J 37/244 | (2006.01) |
| C25D 11/02 | (2006.01) |
| C25D 9/00 | (2006.01) |
| C25D 9/04 | (2006.01) |
| C25D 21/10 | (2006.01) |
| C25D 21/12 | (2006.01) |
| C25D 11/00 | (2006.01) |
| B05D 7/22 | (2006.01) |
| B05C 13/00 | (2006.01) |

(52) U.S. Cl.
CPC ............... *C25D 7/04* (2013.01); *C25D 9/00* (2013.01); *C25D 9/04* (2013.01); *C25D 9/10* (2013.01); *C25D 11/005* (2013.01); *C25D 11/026* (2013.01); *C25D 21/10* (2013.01); *C25D 21/12* (2013.01); *H01J 37/24* (2013.01); *H01J 37/244* (2013.01); *B05C 13/00* (2013.01); *B05D 7/22* (2013.01); *H01J 2237/332* (2013.01); *H01J 2237/3321* (2013.01)

(58) Field of Classification Search
CPC ........ H01J 2237/332; H01J 2237/3321; B05D 7/22; B05C 13/00
USPC ......................................... 204/192.1, 290.01
See application file for complete search history.

(56) References Cited

U.S. PATENT DOCUMENTS

2004/0168637 A1* 9/2004 Gorokhovsky ....... C23C 14/022
118/723 ER

\* cited by examiner

*Primary Examiner* — Thuy V Tran
(74) *Attorney, Agent, or Firm* — Sarika Singh; McNeely, Hare & War LLP (57) ABSTRACT

The present invention relates to a coating method for a plasma block and a plasma block coated by the same. The method comprises processing two sub-blocks capable of being coupled to each other for forming a flowing path; coating the flowing path of one sub-block by injecting an electrolytic solution to the flowing path after displacing an electrode within the flowing path; coating an outer surface of the one sub-block; and coating the other sub-block in the same manner as applied to the one sub-block.

4 Claims, 7 Drawing Sheets

FIG.7

COATING METHOD FOR A PLASMA BLOCK AND A PLASMA BLOCK COATED BY THE SAME

BACKGROUND OF THE INVENTION

1. Field of the Invention

The present invention relates to a coating method for a plasma block and a plasma block coated by the same, in particular the method for coating at least an inner flowing path with an electrolytic plasma processing or with a yttrium oxide composition and the plasma block with the same.

2. Description of the Related Art

A foreign matter such as a silicon may be accumulated in a chamber in a depositing process for producing a semiconductor or LCD display, and a remote plasma can inflow within the chamber to cleaning the foreign matters. The remote plasma for the processing may be generated by a plasma generator located at a remote place to be introduced to a vacuum chamber or a processing chamber. The remote plasma may be generated in a remote plasma source block installed within the plasma generator to be guided within the processing chamber through a transferring path, and an inner path formed in the remote plasma source block or a surface of the remote plasma source block need to be treated for having a necessary durability.

The remote plasma source block may be made of an aluminum or the like, and the inner path or the surface may be contacted directly to the plasma, and an outer surface may be under a strong electrical impact. Therefore, the remote plasma source block should be manufactured to have a strong adhesive property and a strong resistive property to the plasma.

PURPOSE OF THE INVENTION

The purpose of the present invention is provided with a method for coating a remote plasma source block with a plasma electrolytic oxidation or a yttrium oxide composition and a remote plasma source block coated with the same.

SUMMARY OF THE INVENTION

In one embodiment of the present invention, a method for coating a remote plasma source block formed with two sub-blocks comprises processing the two sub-blocks capable of being coupled to each other for forming a flowing path; coating the inner flowing path of one sub-block by injecting an electrolytic solution to the flowing path after displacing a coating electrode within the flowing path; coating an outer surface of the one sub-block; and coating the other sub-block in the same manner as applied to the one sub-block.

In other embodiment of the present invention, coating the inner flowing path comprises detecting a concentration of the electrolytic solution after applying a voltage between the inner flowing path and the coating electrode.

In another embodiment of the present invention, the coating electrode is secured at a coating jig sealing the flowing path.

In still another embodiment of the present invention, a voltage is regulated with a voltage regulating block displaced on the outer surface of the one sub-block.

In still another embodiment of the present invention, a sub-block forming a remote plasma source block installed within a plasma generator comprises at least a flowing path of the sub-block coated with an α-alumina layer in 1 to 100 μm, wherein the α-alumina layer has 0.3 to 1.0 Ra surface roughness and 1,800 to 3,500 HV hardness.

In still another embodiment of the present invention, a sub-block forming a remote plasma source block installed within a plasma generator comprises at least a flowing path of the sub-block coated with a yttrium oxide $Y_2O_3$ layer in 1 to 100 μm, wherein a yttrium oxide $Y_2O_3$ layer has 1,000 to 4,500 HV hardness and 1,000 VAC withstanding voltage.

BRIEF DESCRIPTION OF THE DRAWINGS

The above and other aspects, features and advantages of certain exemplary embodiments of the present invention will be more apparent from the following detailed description taken in conjunction with the accompanying drawings, in which.

DETAILED DESCRIPTION OF EXEMPLARY EMBODIMENTS

Exemplary embodiments of the present invention will be described herein below with reference to the accompanying drawings. In the following description, well-known functions or constructions are not described in detail since they would obscure the invention in unnecessary detail. Also, the terms used herein are defined according to the functions of the present invention. Thus, the terms may vary depending on intension and usage. That is, the terms used herein must be understood based on the descriptions made herein.

Figure 1:
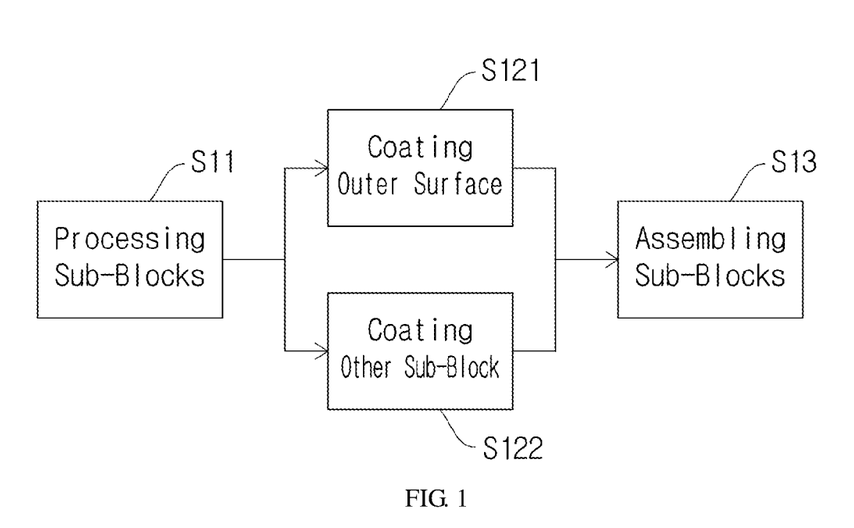
FIG. 1 shows a processing for manufacturing a remote plasma source block using a coating method according to an embodiment of the present invention.

FIG. 1 shows a processing for manufacturing a remote plasma source block using a coating method according to an embodiment of the present invention.

Referring to FIG. 1, the method for coating a remote plasma source block formed with two sub-blocks comprises processing two sub-blocks capable of being coupled to each other for forming a flowing path S11; coating the flowing path of one sub-block by injecting an electrolytic solution to the flowing path after displacing an electrode within the flowing path; coating an outer surface of the one sub-block S121; and coating the other sub-block in the same manner as applied to the one sub-block S122.

Each sub-block may be made of an aluminum or the like to have the same or similar structure, and two sub-blocks may be combined for forming the remote plasma source block. An inner flowing path may be formed in at least one sub-block. The number of the sub-blocks depends on the total structure of the remote plasma source block, and each sub-block may be manufactured through a machining process such as cutting, milling, grinding, polishing or the like.

If each sub-block is manufactured S11, then the inner flowing path may be coated S121.

The sub-block may be coated in an electrolytic bath filled with an electrolytic solution, and a coating jig may be coupled to the sub-block for coating the inner flowing path. And an electrode extending along the inner flowing path is secured at the coating jig to fill the electrolytic solution within the inner flowing path. Then, a voltage may be applied between the sub-block and the electrode to flow a current for coating the inner flowing path. The inner flowing path may be a hollow cylindrical shape or have a plural of hollow cylindrical shapes extending along different directions. An outer surface of the sub-block has a plane shape in general, and a convex-lens like portion or concave lens like portion. A proper coating method may be used depending on each shape. At first, the inner flowing path may be coated, and then the outer surface may be coated with the proper way S122.

Some plasma may contact the inner flowing path directly, therefore the surface of the inner flowing path has to some necessary physical or chemical condition. The inner flowing path may be coated with a PEO (Plasma Electrolytic Oxidation) method or an Yttria Oxide ($Y_2O_3$) method. And the outer surface of the sub-block to contact plasma in negligible amount may be coated with an anodizing method or the like for having proper durability. Otherwise the outer surface may be coated with a PEO (Plasma Electrolytic Oxidation) method or an Yttria Oxide ($Y_2O_3$) method in the course of coating the inner flowing path.

When the coating process for each sub-block is finished by following after treatment, electrical elements such as an igniting electrode, a transformer and the like may be displaced in the sub-blocks to form the remote plasma source block by coupling each other S13. Then the produced remote plasma source block may be installed in the plasma generator for cleaning process.

Figure 2:
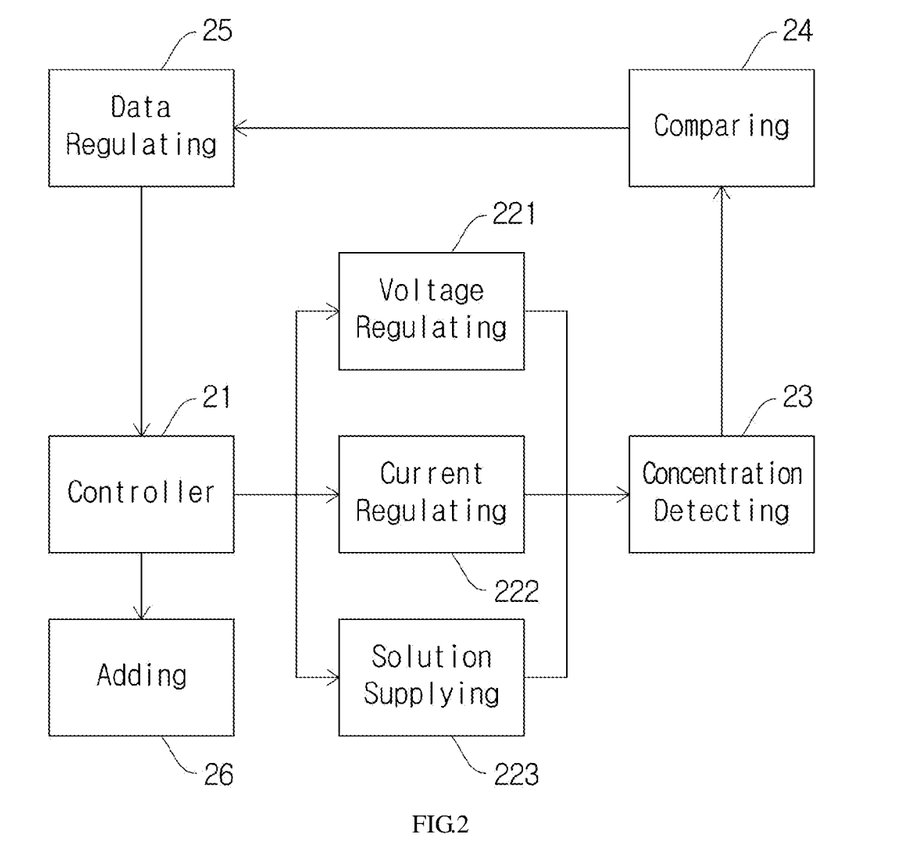
FIG. 2 shows the coating method according to an embodiment of the present invention.

FIG. 2 shows the coating method according to an embodiment of the present invention.

Referring to FIG. 2, the process for coating the inner flowing path of the sub-block may comprise detecting a concentration of the electrolytic solution after applying a voltage and a current. The controller 21 may control the process for coating the inner flowing path or the outer surface of the sub-block, and a coating jig may be prepared for the process. And an electrolytic bath, a device for supply electrical power, a fixing block for fixing the coating jig, a circulating tube for circulating coating solution or the like may be prepared together with the coating jig. The coating solution may comprise $Na_2SiO_3$, KOH, $NiSO_4$, $K_2TiF_6$ or $Ce(NO_3)_3$ or the like. For example, the coating solution may be prepared by solving 5 to 50 g $Na_2SiO_3$ in 1,000 g distilled water. And a solution pH may be 11 to 12 by adding some KOH, for example 0.5 to 1.5 g KOH. And also, 0.5 to 10 g $NiSO_4$ may be added to the solution to reduce pores, and 0.5 to 10 g $Si_3N_4$ may be added to the solution to increase anti-corrosion property, durability property and surface roughness property. The coating solution may be filled into the electrolytic bath, and the sub-block fixed by the coating jig may be displaced in the electrolytic bath. And then the coating electrode may be displaced in the inner flowing path. The circulating tube may be installed to penetrate the coating jig from the outside of the sub-block. And then the sub-block and the coating electrode may be connected electrically to supply some electric power.

The sub-block may be fixed in the electrolytic bath by the coating jig, and the electrolytic solution may be filled in the bath. The device for supplying electric power may be connected to the coating jig, and the voltage and current may be controlled by a voltage regulating unit 221 and a current regulating unit 222. And also, the electrolytic solution can be injected into the inner flowing path by a solution supplying unit 223 to circulate the coating solution via a circulating tube. The voltage regulating unit 221 may regulate the voltage between the sub-block and the coating electrode, for example, in 350 to 500 V. And also, the current regulating unit 222 may regulate the current between the sub-block and the coating electrode, for example, in 10 to 30 $A/dm^2$. The current and voltage may be some direct or alternative, and the current may be applied periodically in pulse form. A coating layer may be formed on an inner surface of the inner flowing path or the outer surface of the sub-block. For example, alpha-alumina layer, gamma-alumina layer or oxidation layer may be formed. Alternatively, an yttria oxidation layer may be formed. A concentration of the electrolytic solution may be lowered, and the change of the concentration can be detected by a concentration detector 23. A temperature, pH and concentration value may be transmitted to a comparator to compare the transmitted information with reference values. And the compared result may be transferred to a data regulating unit 25 for determining whether the temperature, the pH or the concentration should be changed or not. The data regulating unit 25 can produce a new coating data for regulating the electrolytic solution to transfer to the controller 21. And the controller 21 may regulate the electrolytic solution according to the produced regulating data. The regulating values such as the temperature, pH, concentration and the like may be regulated by circulating some electrolytic solution. For example, a complementary unit 26 may regulate the concentration of the electrolytic solution by circulating the electrolytic solution. For example, a portion of the electrolytic solution in the coating bath or the inner flowing path may be discharged outside to inflow some electrolytic solution with different concentration into the coating bath or the inner flowing path. Alternatively, the temperature of the coating bath or the inner flowing path may be regulated for controlling the concentration. When the coating process for each sub-block is completed, the electrolytic solution remaining in the coating bath or the inner flowing path may be discharged outside. And then the coated sub block may be cleaned for after treatment.

Figure 3:
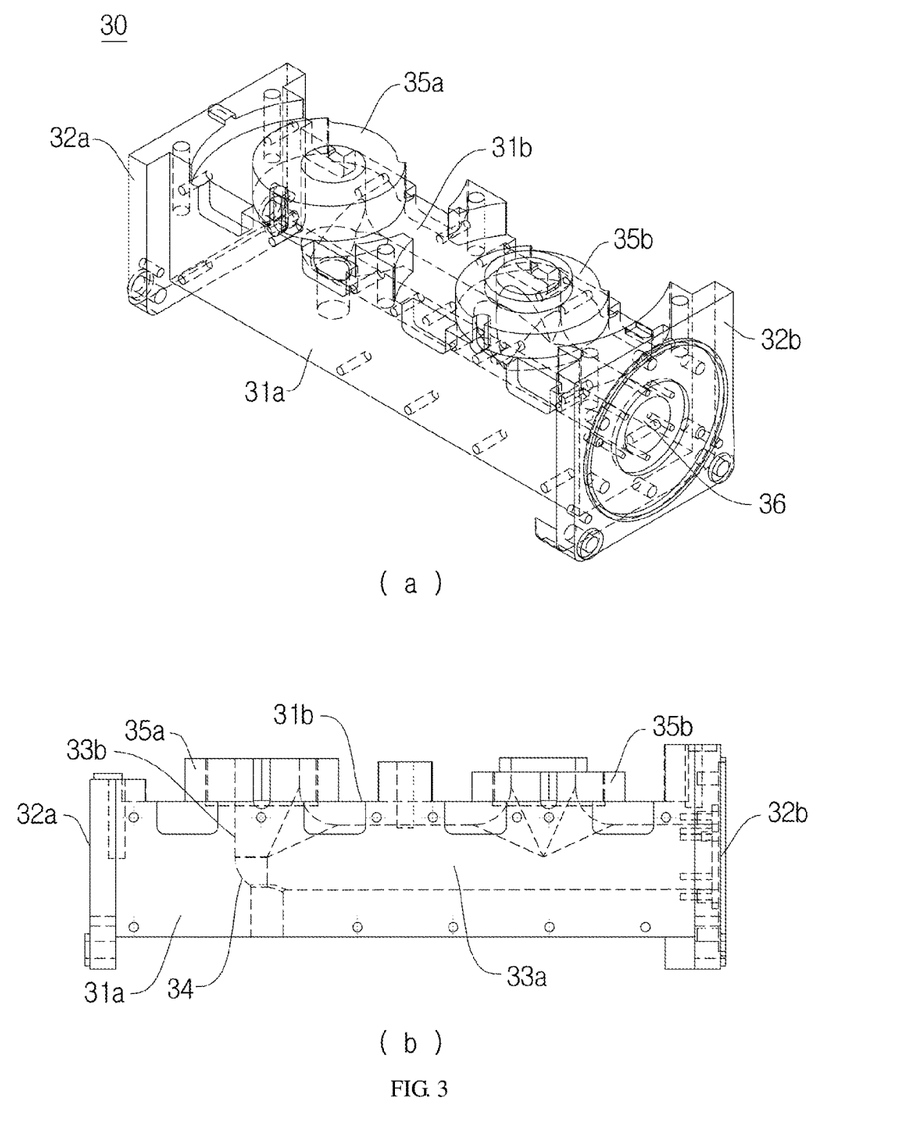
FIG. 3 shows a remote plasma source block comprising two sub-blocks coated using a method according to an embodiment of the present invention.

FIG. 3 shows a remote plasma source block comprising two sub-blocks coated using a method according to an embodiment of the present invention.

Referring to FIG. 3, the sub-block 30 may comprise a block body 31a having a rectangular parallelepiped shape in general; a coupling surface 31b forming the upper surface of the block body 31a; a first and second connecting base unit 32a, 32b formed at both ends of the block body 31a; and a first and second coupling part 35a, 35b coupling sub-blocks each other and connecting the inner flowing paths in each sub-block. And also, a first linear flowing path 33a connected to an opening 36 and a second linear flowing path 33b extending from the first and second coupling part 35a, 36b to an inner part of the sub-block, wherein a cylindrical shape of the first linear flowing path is within the block body 31a. And a curved flowing path may be formed at a crossed portion of the first linear flowing path 33a and the second linear flowing path 23b.

One remote plasma source block may be formed by coupling two sub-blocks 30, and the coupling surface 31b formed in the block body 31a may contact to couple the first and second coupling parts 35a, 35b for forming a path of some plasma. The sub-block 30 can have various structures, for example, depending on plasma generating capacity. Each sub-block 30 can be coated as the process described above, and the flowing path 33a, 33b, 34 can be coated according to the plasma electrolytic oxidation method or the yttria oxidation method. And also, the outer surface of the block body 31a may be coated by the plasma electrolytic oxidation method, the anodizing method or the like.

Figure 4:
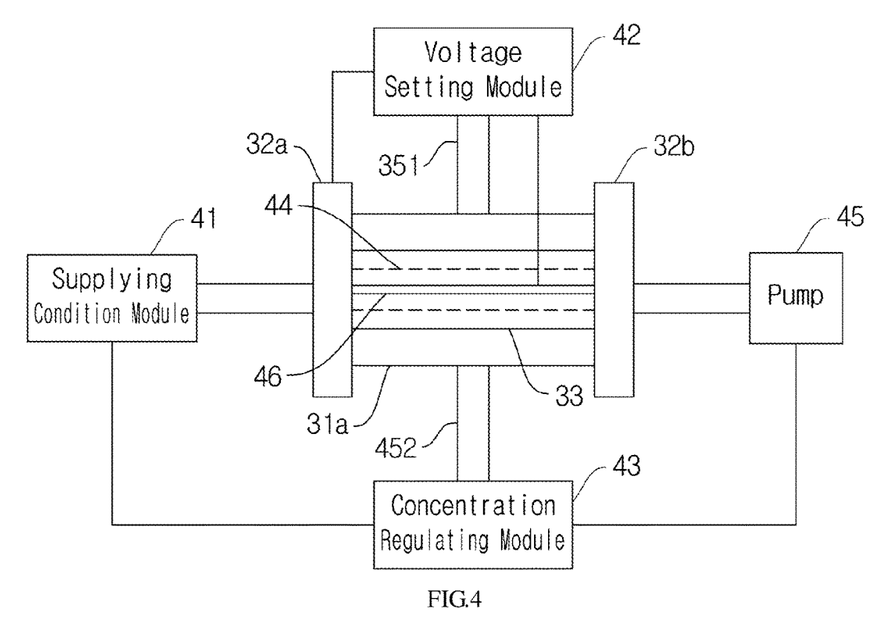
FIG. 4 shows a coating apparatus according to an embodiment of the present invention.

As above-mentioned, the flowing path 33a, 33b, 34 may be coated using the coating jig. FIG. 4 shows a coating apparatus according to an embodiment of the present invention.

Referring to FIG. 4, a coating device for comprises a supplying condition module 41 to regulate a supplying condition of an electrolytic solution for PEO (Plasma Electrolytic Oxidation) coating or YO (Yttria Oxidation) coating; a voltage condition module 42 to regulate a voltage between the block body 31a of the sub-block 30 and the flowing path 33; and a concentration regulating module 43 to regulate an electrolytic solution filled into the flowing path 33 or a coating solution. The electrolytic solution may be made by adding 5 to 30 g $Na_2SiO_3$ to 1,000 g distilled water, and KOH may be added for making total pH of the solution be 11 to 12, if necessary. And also, 0.5 to 10 g $NiSO_4$ may be added to the solution to reduce pores, and 0.5 to 10 g $Si_3N_4$ may be added to the solution to increase anti-corrosion property, durability property and surface roughness property. The supplying condition module 41 may determine each component for the electrolytic solution having pre-determined condition, and the supplying condition module 41 may determine a range of the temperature and pressure of the solution. A circulation tube 44 made from a stainless steel may be installed along the flowing path 33, wherein a plural of through holes in 0.1 to 1.0 mm of average diameter may be formed on the circulation tube 44. The supplying condition module 41 may make the electrolytic solution flow through the circulation tube 44. For example, the electrolytic solution may flow through the circulating tube at 1 to 10 cm/min, and the temperature may be regulated in range of 3 to 20° C. The coating electrode 46 may be displaced in the flowing path 33, and the coating electrode 46 may have a shape of a strip, a rod or the like. If the supplying condition of the electrolytic solution, the voltage condition for coating may be set by the voltage condition module 42. The voltage condition may comprise a voltage of the inner surface of the flowing path, a voltage of the coating electrode and a shape of a current flowing through the electrolytic solution. For example, 300 to 700 V voltage may be applied between the inner surface of the flowing path 33 and the coating electrode 46, and 10 to 30 $mA/cm^2$ current may flow through the solution. The current in unipolar or bipolar may flow in pulse shape with 1.0 to 4.0 mms period. The time for coating may be 3 to 30 minutes, not being limited, depending on a coating thickness. The coating thickness of the flowing path 33 on the surface may be 10 to 100 μm.

A detecting module 351 may detect the voltage the surface of the sub-block, the inner surface of the flowing path 33 or the coating electrode 46 in course of coating. And also, the detecting module 351 may detect the current flowing the electrolytic solution. Furthermore, the detecting module 351 can detect an induced voltage of the circulating tube. The circulating tube 44 may be made of a conductivity material, and have a function of making the surface voltage of the flowing path 33 be uniform in general. A concentration detecting module 452 may detect the concentration of the electrolytic solution filled into the flowing path 33, and a concentration regulating module 43 may control the concentration of the electrolytic solution on based of the detected concentration. For example, a supplying module 45 can inject some distilled water or some electrolytic solution with different concentration into the flowing path 33 to discharge the electrolytic solution filled in the flowing path 33.

Figure 5:
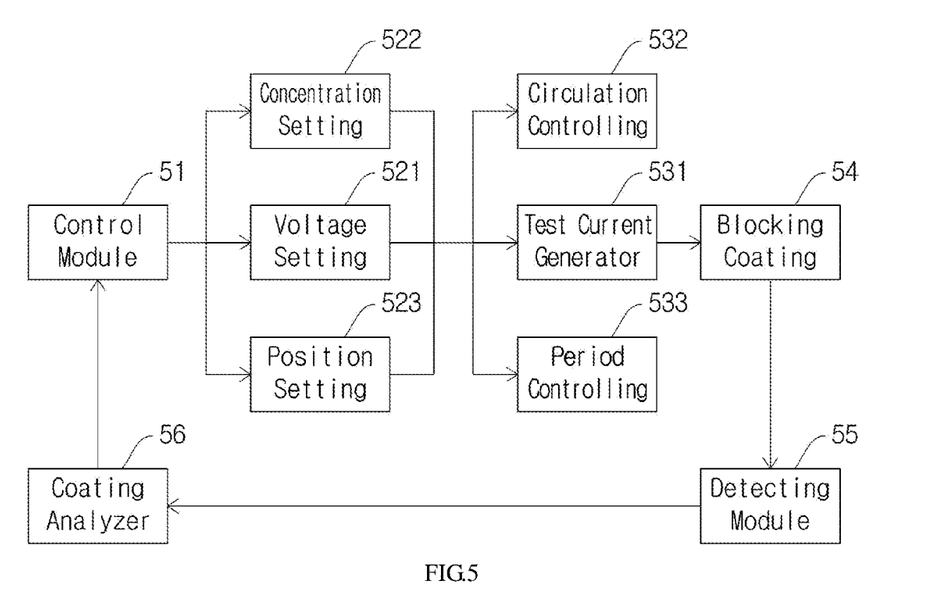
FIG. 5 shows a coating apparatus according to other embodiment of the present invention.

FIG. 5 shows a coating apparatus according to other embodiment of the present invention.

Referring to FIG. 5, a controlling module 51 may control a total coating process. For example, a surface voltage of the flowing path may be regulated by a voltage regulating unit 521, and a concentration of the electrolytic solution may be determined by a concentration setting unit 522. And also, a location of a least one coating electrode to at least one voltage regulating block may be set by a location setting unit 523 on base of the determined voltage. The voltage between the surface of the flowing path and the at least one voltage regulating block may be tested by a test current in a state of being filled with the electrolytic solution within the flowing path. A period regulating unit 533 may regulate an applying period of a current, and a circulation regulating unit 532 may regulate the electrolytic solution concentration by circulating some electrolytic solution, if the concentration changes out of the pre-determined range. A block coating unit 54 may process the flowing path coating, and a detecting module 55 may detect the coating process to transfer the detected information to the coating analyzing unit 56. The detecting module 55 may detect a current in voltage regulating blocks or a resistance, and may monitor a coating state of different parts in the flowing path. And the controlling module 51 may control the setting of the voltage setting unit 521, the concentration setting unit 522 and the location setting unit 523.

Figure 6:
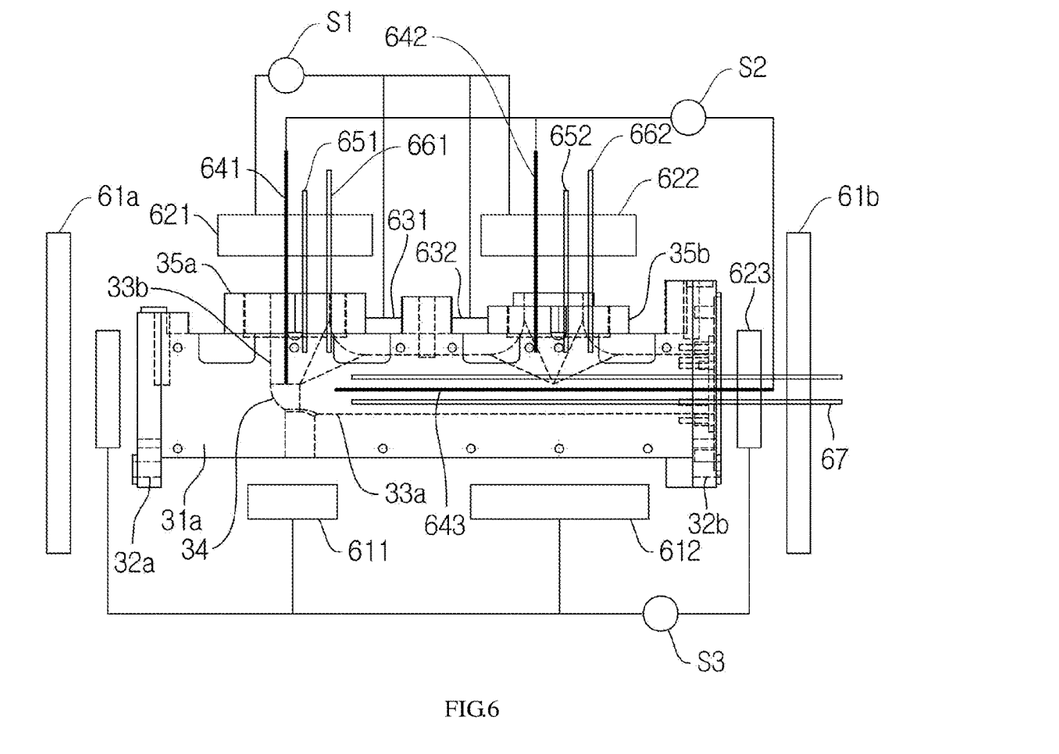
FIG. 6 shows a coating apparatus according to another embodiment of the present invention.

FIG. 6 shows a coating apparatus according to another embodiment of the present invention.

Referring to FIG. 6, a coating jig for coating the flowing path 33a, 33b, 34 of the sub-block may comprise a fixing block 61a, 61b for fixing the sub-block, and the sub-block may be secured at a pre-determined location in the coating bath by the fixing block 61a, 61b. The fixing block 61a, 61b may have a structure of absorbing a vibration, and may be made of insulating material. A plural of voltage regulating blocks 621, 622, 623 may be coupled around the sub-block and at least one regulating block 621, 622, 623 may seal coupling parts 35a, 35b and an opening. And at least one voltage regulating block 621, 622, 623 may have a through hoe function to install a detecting unit, an injecting unit or a discharging unit. For example, a first coating electrode 641 and a first detecting unit 651 may extend from inside to outside of the flowing path penetrating the first voltage regulating block 621, while a second coating electrode 642 and a second detecting unit 652 may extend from inside to outside of the sub-block penetrating the second voltage regulating block 622. And also, the first and second coupling part 35a, 35b may be sealed by the first and second voltage regulating block 621, 622. The circulating tube 643 may be installed in the third voltage regulating block 623, wherein the circulating tube 643 may inject some electrolytic solution into the flowing path 33a, 33b, 34 or discharge some electrolytic solution outside. And the third coating electrode 643 may be secured by the third voltage regulating block 623, and the opening of the sub-block may be sealed by the third voltage regulating block 623.

According to one embodiment of the present invention, at least one complimentary voltage regulating block 631, 632 may be installed in the coupling surface, and at least one uniform field regulating block 611, 612 may be installed, for example, in a side surface of the block body 31a or a bottom surface of the block body 31a, The voltage regulating blocks 611, 612, 621, 622, 623, 631, 632 may be various outer surfaces of the sub-block separately each other. And also, some voltage regulating blocks may be located in symmetry, for example the third voltage regulating block, and an equivalent voltage may be applied to the voltage regulating blocks. And also, each coating electrode 641, 642, 643 may be connected to a voltage regulating unit S2 for having the same voltage. And also different voltage regulating blocks 621, 622, 631, 632 may be connected a same voltage regulating unit S1. If necessary, at least one voltage regulating block 623, 611, 612 may be connected to a different voltage regulating unit S3 having a different voltage from that of the first and second voltage regulating unit S1, S2, wherein the third voltage regulating unit S3 may be a variable voltage device. The flowing path 33a, 33b, 34 can have a pre-determined electric field in general by displacing each voltage regulating unit 611, 612, 621, 622, 631, 632 separately each other on the surface of the sub-block. And also, a test current may be applied between different voltage regulating blocks 611, 612, 621, 622, 631, 632, if necessary. In particular, the electric field of a curved flowing path 34 may be made in a pre-determined value. For example, the electric field value of the curved flowing path 34 may be higher 3% to 8% than that of the linear flowing path 33a, 33b. Hence, a uniform coating layer by PEO coating or YO coating may be formed on the curved flowing path 34.

The flowing path 33a, 33b, 34 may be filled with the electrolytic solution using the circulating tube 67, and some electrolytic solution may be supplemented by the circulating tube 67. And the temperature of the electrolytic solution may be controlled in the course of coating. A temperature regulating means 661, 662 may be installed for transferring hot or cold fluid, wherein the temperature regulating means 661, 662 may extend within the sub-block through the first and second voltage regulating block 621, 622. And the electrolytic solution temperature in the flowing path 33a, 33b, 34 may be controlled in a range of 3 to 20° C. The coating electrode 641, 642, 643 corresponding to a cathode may extend along the flowing path 33a, 33b, 34, and have a cylindrical shape similar to that of the flowing path 33a, 33b, 34, not being limited.

Figure 7:
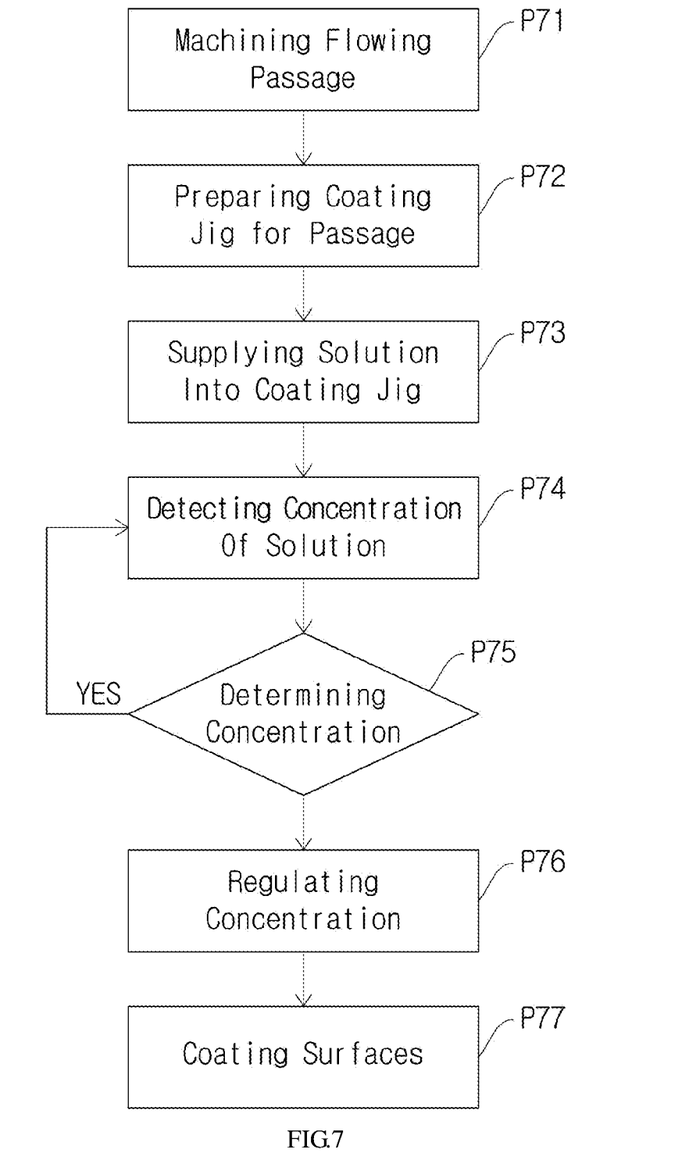
FIG. 7 shows a method for coating sub-block according to an embodiment of the present invention.

FIG. 7 shows a method for coating sub-block according to an embodiment of the present invention.

Referring to FIG. 7, a method for coating a sub-block forming a remote plasma source block comprises processing a flowing path within the sub-block P71; preparing a coating jig having an coating electrode for coating the flowing path P72; injecting a electrolytic solution through the coating jig P73; detecting a concentration of the injected electrolytic solution P74; and applying a voltage between the sub-block and the coating electrode with the concentration regulated P75; and being coating the flowing path and a surface of the sub-block P77.

The electrolytic solution may comprise $Na_2SiO_3$, KOH, $NiSO_4$, $K_2TiF_6$, or $Ce(NO_3)_3$, and the coating electrode may be made from a stainless steel, Pt or the like. The electrolytic solution may have a pre-determined concentration, and the concentration may be detected P75. If the concentration is in the pre-determined range YES, then the detection may continue. While if the concentration is out of the range NO, the solution concentration may be regulated. 350 to 500 V voltage may be applied between the surface of the sub-block and the coating electrode, and 10 to 30 $A/dm^2$ current may flow through the electrolytic solution.

An oxidation layer such as an alpha-alumina layer, a gamma-alumina or yttria oxide may be formed on an outer surface of the sub-block or the surface of the flowing surface. And the resultant physical properties are following.

A. Yttria Coating Layer
Coating thickness: 1 to 100 μm
Withstanding voltage: 1,000 to 4,000 ACV
Surface hardness: 1,000 to 4,000 HV
Surface roughness: 0.5 to 1.0 ra
Dielectric constant: 20 to 40

B. Plasma Electrolytic Coating
Coating thickness: 1 to 100 μm
Adhesive strength: Above 40 Mpa (under 500° C. condition)
Dielectric constant: 16 to 50
Withstanding voltage: Above 1,000 ACV
Surface hardness: Above 800
Surface roughness: 0.3 to 1.0 Ra
Withstanding corrosion: 18,000 hours (by neutral salt spray testing)

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A method for coating a remote plasma source block formed with two sub-blocks, comprises:
    processing the two sub-blocks capable of being coupled to each other for forming a flowing path;
    coating the inner flowing path of one sub-block by injecting an electrolytic solution to the flowing path after displacing coating electrode within the flowing path;
    coating an outer surface of the one sub-block; and
    coating the other sub-block in the same manner as applied to the one sub-block.

2. The method according to claim 1, wherein coating the inner flowing path comprises detecting a concentration of the electrolytic solution after applying a voltage between the inner flowing path and the coating electrode.

3. The method according to claim 1, wherein the coating electrode is secured at a coating jig sealing the flowing path.

4. The method according to claim 1, wherein a voltage is regulated with a voltage regulating block displaced on the outer surface of the one sub-block.

* * * * *